United States Patent
Arikata et al.

(10) Patent No.: US 10,326,034 B2
(45) Date of Patent: Jun. 18, 2019

(54) SEMICONDUCTOR LAMINATE AND LIGHT-RECEIVING ELEMENT

(71) Applicant: SUMITOMO ELECTRIC INDUSTRIES, LTD., Osaka-shi, Osaka (JP)

(72) Inventors: Suguru Arikata, Itami (JP); Takuma Fuyuki, Itami (JP); Susumu Yoshimoto, Itami (JP); Takashi Kyono, Itami (JP); Katsushi Akita, Itami (JP)

(73) Assignee: SUMITOMO ELECTRIC INDUSTRIES, LTD., Osaka-shi, Osaka (JP)

( * ) Notice: Subject to any disclaimer, the term of this patent is extended or adjusted under 35 U.S.C. 154(b) by 0 days.

(21) Appl. No.: 16/073,006

(22) PCT Filed: Jan. 24, 2017

(86) PCT No.: PCT/JP2017/002236
§ 371 (c)(1),
(2) Date: Jul. 26, 2018

(87) PCT Pub. No.: WO2017/130929
PCT Pub. Date: Aug. 3, 2017

(65) Prior Publication Data
US 2019/0044010 A1 Feb. 7, 2019

(30) Foreign Application Priority Data
Jan. 27, 2016 (JP) .................................. 2016-013120

(51) Int. Cl.
*H01L 31/0328* (2006.01)
*H01L 31/0304* (2006.01)
(Continued)

(52) U.S. Cl.
CPC .. *H01L 31/03042* (2013.01); *H01L 27/14652* (2013.01); *H01L 31/03046* (2013.01);
(Continued)

(58) Field of Classification Search
CPC ......... H01L 31/035236; H01L 31/1844; H01L 27/14652; H01L 31/03046; H01L 31/109;
(Continued)

(56) References Cited

U.S. PATENT DOCUMENTS 5,446,293 A * 8/1995 Chu ................... B82Y 10/00
257/190
5,939,729 A * 8/1999 Chu ................... B82Y 20/00
257/197
(Continued)

OTHER PUBLICATIONS

Rubin Sidhu et al., "A Long-Wavelength Photodiode on InP Using Lattice-Matched GaInAs—GaAsSb Type-II Quantum Wells," IEEE Photonics Technology Letters, Dec. 2005, pp. 2715-2717, vol. 17, No. 12.

*Primary Examiner* — Shouxiang Hu
(74) *Attorney, Agent, or Firm* — Drinker Biddle & Reath LLP

(57) ABSTRACT

A semiconductor layer includes a first semiconductor layer containing a III-V group compound semiconductor and having a first conductivity type, a quantum-well structure containing a III-V group compound semiconductor, a second semiconductor layer containing a III-V group compound semiconductor, a third semiconductor layer containing a III-V group compound semiconductor, and a fourth semiconductor layer containing a III-V group compound semiconductor and having a second conductivity type different from the first conductivity type. The first semiconductor layer, the quantum-well structure, the second semiconductor layer, the third semiconductor layer, and the fourth semiconductor layer are stacked in this order. The concentration (Continued)

of an impurity that generates carriers of the second conductivity type is lower in the third semiconductor layer than in the fourth semiconductor layer. The concentration of an impurity that generates majority carriers in the second semiconductor layer is lower in the third semiconductor layer than in the second semiconductor layer.

13 Claims, 6 Drawing Sheets

(51) Int. Cl.
*H01L 31/101* (2006.01)
*H01L 31/0352* (2006.01)
*H01L 31/105* (2006.01)
*H01L 27/146* (2006.01)
*H01L 31/109* (2006.01)
*H01L 31/18* (2006.01)

(52) U.S. Cl.
CPC .... *H01L 31/03048* (2013.01); *H01L 31/0352* (2013.01); *H01L 31/035209* (2013.01); *H01L 31/035236* (2013.01); *H01L 31/101* (2013.01); *H01L 31/105* (2013.01); *H01L 31/109* (2013.01); *H01L 31/1844* (2013.01)

(58) Field of Classification Search
CPC ............... H01L 31/105; H01L 31/0352; H01L 31/03042; H01L 31/101; H01L 31/03048; H01L 31/035209
See application file for complete search history.

(56) References Cited

U.S. PATENT DOCUMENTS

| | | | |
|---|---|---|---|
| 2004/0052490 A1* | 3/2004 | Miyazaki | G02F 1/025 385/131 |
| 2007/0158638 A1* | 7/2007 | Perera | B82Y 20/00 257/13 |
| 2013/0313521 A1* | 11/2013 | Akita | H01L 31/035209 257/21 |

* cited by examiner

SEMICONDUCTOR LAMINATE AND LIGHT-RECEIVING ELEMENT

TECHNICAL FIELD

The present invention relates to a semiconductor laminate and a light-receiving element.

The present application claims priority to Japanese Patent Application No. 2016-013120 filed in the Japan Patent Office on Jan. 27, 2016, the entire contents of which is incorporated herein by reference.

BACKGROUND ART

Conventional semiconductor laminates containing III-V group compound semiconductors can be used for the production of light-receiving elements sensitive to light in the infrared region. Specifically, for example, a buffer layer, a quantum-well absorption layer, and a contact layer, which contain III-V group compound semiconductors, are sequentially stacked on a substrate containing a III-V group compound semiconductor, and appropriate electrodes are formed, thereby providing a light-receiving element for infrared radiation. Regarding such a light-receiving element, a photodiode having a cutoff wavelength of 2 µm to 5 µm is reported (for example, see NPL 1).

CITATION LIST

Non Patent Literature

NPL 1: R. Sidhu, et al., "A Long-Wavelength Photodiode on InP Using Lattice-Matched GaInAs—GaAsSb Type-II Quantum Wells", IEEE PHOTONICS TECHNOLOGY LETTERS, VOL. 17, NO. 12, DECEMBER 2005, p. 2715-2717

SUMMARY OF INVENTION

A semiconductor laminate according to the present invention includes a first semiconductor layer containing a III-V group compound semiconductor and having a first conductivity type, a quantum-well absorption layer containing a III-V group compound semiconductor, a second semiconductor layer containing a III-V group compound semiconductor, a third semiconductor layer containing a III-V group compound semiconductor, and a fourth semiconductor layer containing a III-V group compound semiconductor and having a second conductivity type different from the first conductivity type. The first semiconductor layer, the quantum-well absorption layer, the second semiconductor layer, the third semiconductor layer, and the fourth semiconductor layer are stacked in this order. The concentration of an impurity that generates carriers of the second conductivity type is lower in the third semiconductor layer than in the fourth semiconductor layer. The concentration of an impurity that generates majority carriers in the second semiconductor layer is lower in the third semiconductor layer than in the second semiconductor layer.

DESCRIPTION OF EMBODIMENTS

Problem to be Solved by Disclosure

Figure 1:
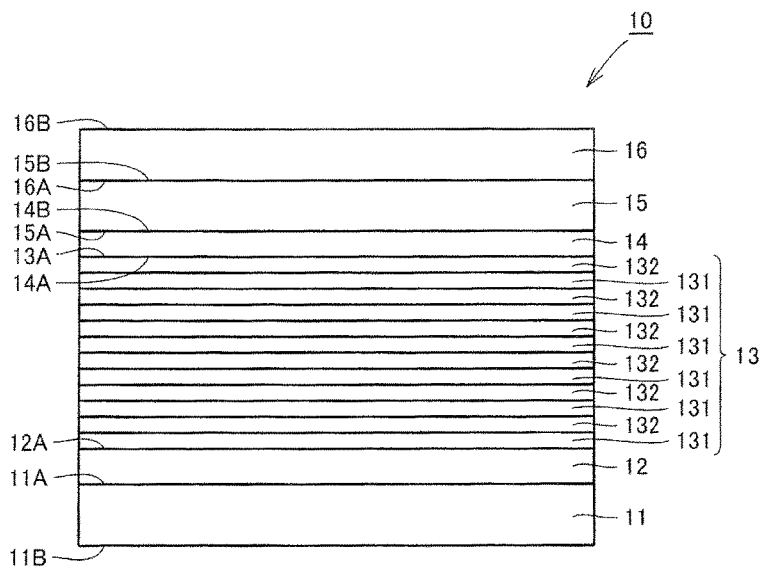
FIG. 1 is a schematic cross-sectional view illustrating the structure of a semiconductor laminate according to a first embodiment.

In light-receiving elements including semiconductor layers containing III-V group compound semiconductors in the related art described above, a problem can arise that sensitivity is not sufficiently improved. Thus, it is an object to provide a semiconductor laminate capable of improving the sensitivity of a light-receiving element including a semiconductor layer containing a III-V group compound semiconductor and to provide a light-receiving element.

Advantageous Effects of Disclosure

According to a semiconductor laminate of the present invention, the sensitivity of a light-receiving element including a semiconductor layer containing a III-V group compound semiconductor can be improved.

DESCRIPTION OF EMBODIMENTS OF INVENTION

Embodiments of the present invention are first listed and explained. A semiconductor laminate of the present invention includes a first semiconductor layer containing a III-V group compound semiconductor and having a first conductivity type, a quantum-well absorption layer containing a III-V group compound semiconductor, a second semiconductor layer containing a III-V group compound semiconductor, a third semiconductor layer containing a III-V group compound semiconductor, and a fourth semiconductor layer containing a III-V group compound semiconductor and having a second conductivity type different from the first conductivity type. The first semiconductor layer, the quantum-well absorption layer, the second semiconductor layer, the third semiconductor layer, and the fourth semiconductor layer are stacked in this order. The concentration of an impurity that generates carriers of the second conductivity type is lower in the third semiconductor layer than in the fourth semiconductor layer. The concentration of an impurity that generates majority carriers in the second semiconductor layer is lower in the third semiconductor layer than in the second semiconductor layer.

The inventors have investigated a method for increasing the sensitivity of a light-receiving element having a structure in which a semiconductor layer of a first conductivity type and a semiconductor layer of a second conductivity type are disposed with a quantum-well absorption layer provided therebetween, the quantum-well absorption layer containing a III-V group compound semiconductor. The results revealed that an impurity introduced into the semiconductor layer in order to generate majority carriers is diffused into a quantum-well absorption layer to degrade the sensitivity. To inhibit the diffusion of the impurity, it is conceivable that a low-impurity-concentration semiconductor layer having a lower impurity concentration than the semiconductor layers may be disposed between the quantum-well absorption layer and the semiconductor layers. However, the use of a structure in which the low-impurity-concentration semiconductor layer is in direct contact with the quantum-well absorption layer generates carriers at the interface between the low-impurity-concentration semiconductor layer and the quantum-well absorption layer to inhibit the spreading of a depletion layer, thereby disadvantageously decreasing the sensitivity of the light-receiving element. The investigation by the inventors indicates that in the case where an intermediate semiconductor layer having a higher impurity concentration than the low-impurity-concentration semiconductor layer is disposed between the low-impurity-concentration semiconductor layer and the quantum-well absorption layer, the intermediate semiconductor layer can reduce the generation of the carriers while the diffusion of the impurity from the semiconductor layer to the quantum-well absorption layer is inhibited, thereby increasing the sensitivity of the light-receiving element.

In the semiconductor laminate of the present invention, the third semiconductor layer serving as the low-impurity-concentration semiconductor layer is disposed between the fourth semiconductor layer and the quantum-well absorption layer. Furthermore, the second semiconductor layer corresponding to the intermediate semiconductor layer is disposed between the third semiconductor layer and the quantum-well absorption layer. Thus, the second semiconductor layer can reduce the generation of the carriers while the third semiconductor layer inhibits the diffusion of the impurity from the fourth semiconductor layer to the quantum-well absorption layer, thereby increasing the sensitivity of the light-receiving element produced using the semiconductor laminate of the present invention. According to the semiconductor laminate of the present invention as described above, the semiconductor laminate capable of improving the sensitivity of a light-receiving element including a semiconductor layer containing a III-V group compound semiconductor can be provided.

In the semiconductor laminate, each of the concentration of the impurity that generates carriers of the first conductivity type and the concentration of the impurity that generates the carriers of the second conductivity type in the third semiconductor layer may be less than $5 \times 10^{14}$ $cm^{-3}$. In this case, the impurity can be more reliably inhibited from reaching the quantum-well absorption layer by diffusion.

In the semiconductor laminate, the concentration of the impurity that generates the majority carriers in the second semiconductor layer may be equal to or lower than the concentration of the impurity that generates the carriers of the second conductivity type in the fourth semiconductor layer. In this case, the diffusion of the impurity contained in the second semiconductor layer into the quantum-well absorption layer can be inhibited so as not to cause a decrease in sensitivity.

In the semiconductor laminate, the concentration of the impurity that generates the majority carriers in the second semiconductor layer may be $5 \times 10^{14}$ $cm^{-3}$ or more and $5 \times 10^{18}$ $cm^{-3}$ or less. In this case, the generation of the carriers in a region between the third semiconductor layer and the quantum-well absorption layer can be more reliably reduced while the diffusion of the impurity contained in the second semiconductor layer into the quantum-well absorption layer can be inhibited so as not to cause a decrease in sensitivity.

In the semiconductor laminate, the second semiconductor layer may have a smaller thickness than the third semiconductor layer. In this case, the diffusion of the impurity contained in the second semiconductor layer into the quantum-well absorption layer can be inhibited so as not to cause a decrease in sensitivity.

In the semiconductor laminate, the second semiconductor layer may have a thickness of 500 nm or less. In this case, the diffusion of the impurity contained in the second semiconductor layer into the quantum-well absorption layer can be inhibited so as not to cause a decrease in sensitivity.

In the semiconductor laminate, the impurity that generates the majority carriers in the second semiconductor layer may be one or more selected from the group consisting of Si (silicon), S (sulfur), Se (selenium), Ge (germanium), Te (tellurium), and Sn (tin) or one or more selected from the group consisting of Zn (zinc), Be (beryllium), Mg (magnesium), and C (carbon). These impurities are preferred as n-type impurities or p-type impurities contained in the second semiconductor layer containing the III-V group compound semiconductor.

In the semiconductor laminate, the quantum-well absorption layer may have a multi-quantum-well structure including a pair of an $In_nGa_{1-x}As$ (indium gallium arsenide, x represents 0.38 or more and 1 or less) layer and a $GaAs_{1-y}Sb_y$ (gallium arsenide antimonide, y represents 0.36 or more and 1 or less) layer, or a pair of a $Ga_{1-u}In_uN_vAs_{1-v}$ (gallium indium nitride arsenide, u represents 0.4 or more and 0.8 or less, and v represents more than 0 and 0.2 or less) layer and a $GaAs_{1-y}Sb_y$ (y represents 0.36 or more and 0.62 or less) layer. This makes the semiconductor laminate to be appropriate for a light-receiving element sensitive to light in the near-infrared region to the mid-infrared region.

The semiconductor laminate may further include a substrate located on an opposite side of the first semiconductor layer from the quantum-well absorption layer. The substrate may contain gallium arsenide (GaAs), gallium phosphide (GaP), gallium antimonide (GaSb), indium phosphide (InP), indium arsenide (InAs), indium antimonide (InSb), aluminum antimonide (AlSb), or aluminum arsenide (AlAs). This facilitates the use of the quantum-well absorption layer appropriate for the detection of light in the near-infrared region to the mid-infrared region.

In the semiconductor laminate, the second semiconductor layer may contain a III-V group compound semiconductor identical to that in the semiconductor layer included in the quantum-well absorption layer. This can inhibit the occurrence of strain in the quantum-well absorption layer due to a difference in lattice constant.

In the semiconductor laminate, the quantum-well absorption layer may have a thickness of 1 μm or more. In this case, a light-receiving element having good sensitivity is easily produced with the semiconductor laminate.

In the semiconductor laminate, each of the oxygen concentration, the carbon concentration, and the hydrogen concentration at each of the interface between the first semiconductor layer and the quantum-well absorption layer, the interface between the quantum-well absorption layer and the second semiconductor layer, the interface between the second semiconductor layer and the third semiconductor layer, and the interface between the third semiconductor layer and the fourth semiconductor layer may be $1 \times 10^{17}$ cm$^{-3}$ or less. In this case, the dark current of a light-receiving element produced with the semiconductor laminate can be inhibited.

In the semiconductor laminate, the first semiconductor layer, the quantum-well absorption layer, the second semiconductor layer, the third semiconductor layer, and the fourth semiconductor layer may be stacked without forming a regrown interface. In this case, the dark current of the light-receiving element produced with the semiconductor laminate can be inhibited. The regrown interface is an interface where at least one element selected from the group consisting of oxygen, hydrogen, and carbon is accumulated. In the regrown interface, the concentration of the at least one element selected from the group consisting of oxygen, hydrogen, and carbon is higher than, for example, $1 \times 10^{17}$ cm$^{-3}$.

A light-receiving element of the present invention includes the semiconductor laminate and an electrode disposed on the semiconductor laminate. The light-receiving element of the present invention includes the semiconductor laminate of the present invention. Thus, the light-receiving element of the present invention has improved sensitivity.

Details of Embodiments of Invention

Embodiments of a semiconductor laminate according to the present invention will be described below with reference to the drawings. In the drawings, the same or equivalent portions are designated using the same reference numerals, and descriptions are not redundantly repeated.

First Embodiment

As illustrated in FIG. 1, a semiconductor laminate 10 according to a first embodiment includes a substrate 11, a first semiconductor layer 12, a quantum-well structure 13 serving as a quantum-well absorption layer, a second semiconductor layer 14, a third semiconductor layer 15, and a fourth semiconductor layer 16.

The substrate 11 contains a III-V group compound semiconductor. The diameter of the substrate 11 is 50 mm or more and, for example, 3 inches. As the III-V group compound semiconductor contained in the substrate 11, for example, GaAs, GaP, GaSb, InP, InAs, InSb, AlSb, or AlAs may be used. The use of the substrate 11 containing the III-V group compound semiconductor provides the semiconductor laminate 10 appropriate for the production of a light-receiving element for infrared light.

Specifically, for example, InP having n-type conductivity (n-InP) is used as a compound semiconductor contained in the substrate 11. As an n-type impurity contained in the substrate 11, for example, sulfur (S) may be used. The substrate 11 may have a diameter of 80 mm or more (for example, 4 inches), even 100 mm or more (for example, 5 inches), even more 130 mm or more (for example, 6 inches), in order to improve the production efficiency and the yield of a semiconductor device (light-receiving element) including the semiconductor laminate 10.

The first semiconductor layer 12 is a semiconductor layer disposed in contact with a first main surface 11A of the substrate 11. The first semiconductor layer 12 contains a III-V group compound semiconductor. As the III-V group compound semiconductor contained in the first semiconductor layer 12, for example, a binary material, such as GaSb, AlSb, or InSb, or a ternary material, such as gallium indium antimonide (GaInSb), aluminum indium antimonide (AlInSb), aluminum gallium antimonide (AlGaSb), or InGaAs, may be used. Specifically, for example, InGaAs having n-type conductivity (n-InGaAs) is used as a compound semiconductor contained in the first semiconductor layer 12. As an n-type impurity contained in the first semiconductor layer 12, for example, Si, S, Se, Ge, Te, or Sn may be used.

The quantum-well structure 13 is disposed in contact with a first main surface 12A of the first semiconductor layer 12 facing away from the substrate 11. The quantum-well structure 13 has a structure in which two element layers each containing a III-V group compound semiconductor are alternately stacked. Specifically, the quantum-well structure 13 has a structure in which a first element layer 131 and a second element layer 132 are alternately stacked. As a material of the first element layer 131, for example, $In_xGa_{1-x}As$ (where x represents 0.38 or more and 1 or less) may be used. As a material of the second element layer 132, for example, $GaAs_{1-y}Sb_y$ (where y represents 0.36 or more and 1 or less) may be used. The materials contained in the first element layer 131 and the second element layer 132 are not limited to the foregoing materials. As a material of the first element layer 131, for example, $Ga_{1-u}In_uN_vAs_{1-v}$ (where u represents 0.4 or more and 0.8 or less, and v represents more than 0 and 0.2 or less) may be used. As a material of the second element layer 132, for example, $GaAs_{1-y}Sb_y$ (where y represents 0.36 or more and 0.62 or less) may be used.

By using the quantum-well absorption layer having a multi-quantum-well structure including a pair of the $In_xGa_{1-x}As$ (where x represents 0.38 or more and 1 or less) layer and the $GaAs_{1-y}Sb_y$ (where y represents 0.36 or more and 1 or less) layer, or a pair of the $Ga_{1-u}In_uN_vAs_{1-v}$ (where u represents 0.4 or more and 0.8 or less, and v represents more than 0 and 0.2 or less) layer and the $GaAs_{1-y}Sb_y$ (where y represents 0.36 or more and 0.62 or less) layer, the semiconductor laminate 10 that can be used for the production of a light-receiving element appropriate for the detection of light in the near-infrared region to the mid-infrared region can be provided. Each of the first element layer 131 and the second element layer 132 may have a thickness of, for example, 5 nm. The quantum-well structure 13 may be a structure in which, for example, 250 unit structures each including the first element layer 131 and the second element layer 132 are stacked. That is, the quantum-well structure 13 may have a thickness of, for example, 2.5 μm.

As a material of the first element layer 131, InAs may be used. As a material of the second element layer 132, GaSb may be used. The use of a multi-quantum-well structure including a pair of an InAs layer and a GaSb layer as a quantum-well absorption layer can provide the semiconductor laminate 10 that can be used for the production of a light-receiving element appropriate for the detection of infrared rays having a wavelength of 4 to 12 μm.

To make compensation for the strain of the quantum-well structure 13, the unit structure of the quantum-well structure 13 may further include a strain compensation layer in addition to the first element layer 131 and the second element layer 132. Although the quantum-well structure 13 is a multi-quantum-well structure in this embodiment, a single-quantum-well structure may be used instead thereof.

As illustrated in FIG. 1, the second semiconductor layer 14 is disposed in contact with a main surface 13A of the quantum-well structure 13 facing away from the first semiconductor layer 12. The second semiconductor layer 14 contains a III-V group compound semiconductor having p-type conductivity. The second semiconductor layer 14 has one main surface 14A in contact with the quantum-well structure 13 and the other main surface 14B in contact with the third semiconductor layer 15.

As a III-V group compound semiconductor contained in the second semiconductor layer 14, a III-V group compound semiconductor identical to that contained in the first element layer 131 or the second element layer 132 included in the quantum-well structure 13 may be used. As a p-type impurity contained in the second semiconductor layer 14, for example, one or more elements selected from the group consisting of Zn, Be, Mg, and C may be used. The concentration of the p-type impurity contained in the second semiconductor layer 14 may be, for example, $5 \times 10^{14}$ cm$^{-3}$ or more and $5 \times 10^{18}$ cm$^{-3}$ or less. The second semiconductor layer 14 may have a thickness of, for example, 500 nm or less.

The third semiconductor layer 15 is disposed in contact with the second main surface 14B of the second semiconductor layer 14 facing away from the quantum-well structure 13. The third semiconductor layer 15 has one main surface 15A in contact with the second semiconductor layer 14 and the other main surface 15B in contact with the fourth semiconductor layer 16.

The third semiconductor layer 15 contains a III-V group compound semiconductor. A material of the third semiconductor layer 15 may be determined in view of lattice matching with adjoining semiconductor layers. Specifically, the third semiconductor layer 15 may contain, for example, InGaAs. The third semiconductor layer 15 may have a thickness of, for example, 50 nm or more. The concentration of a p-type impurity in the third semiconductor layer 15 is, for example, less than $5 \times 10^{14}$ cm$^{-3}$.

The fourth semiconductor layer 16 is disposed in contact with the main surface 15B of the third semiconductor layer 15 facing away from the second semiconductor layer 14. The fourth semiconductor layer 16 contains a III-V group compound semiconductor having p-type conductivity.

As a III-V group compound semiconductor contained in the fourth semiconductor layer 16, for example, InP, InAs, GaSb, GaAs, or InGaAs may be used. Specifically, for example, InGaAs having p-type conductivity (p-InGaAs) is used as a compound semiconductor of the fourth semiconductor layer 16. As a p-type impurity contained in the fourth semiconductor layer 16, for example, Zn, Be, Mg, or C may be used.

The concentration of the p-type impurity is lower in the third semiconductor layer 15 than in the fourth semiconductor layer 16 and is lower in the third semiconductor layer 15 than in the second semiconductor layer 14. That is, in the semiconductor laminate 10, the third semiconductor layer 15 having a lower concentration of the p-type impurity than the fourth semiconductor layer 16 is disposed between the fourth semiconductor layer 16 and the quantum-well structure 13. Furthermore, the second semiconductor layer 14 having a higher concentration of the p-type impurity than the third semiconductor layer 15 is disposed between the third semiconductor layer 15 and the quantum-well structure 13. Thus, the second semiconductor layer 14 can reduce the generation of carriers in a region between the third semiconductor layer 15 and the quantum-well structure 13 while the third semiconductor layer 15 inhibits the diffusion of the impurity from the fourth semiconductor layer 16 to the quantum-well structure 13. Thereby, the sensitivity of a light-receiving element produced with the semiconductor laminate 10 is increased.

In the semiconductor laminate 10, the concentration of the p-type impurity is preferably lower in the second semiconductor layer 14 than in the fourth semiconductor layer 16. In this case, the diffusion of the p-type impurity contained in the second semiconductor layer 14 into the quantum-well structure 13 can be inhibited so as not to cause a decrease in sensitivity.

In the semiconductor laminate 10, the second semiconductor layer 14 preferably has a smaller thickness than the third semiconductor layer 15. In this case, the diffusion of the p-type impurity contained in the second semiconductor layer 14 into the quantum-well structure 13 can be inhibited so as not to cause a decrease in sensitivity.

In the semiconductor laminate 10, the quantum-well structure 13 preferably has a thickness of 1 μm or more. In this case, a light-receiving element having good sensitivity is easily produced with the semiconductor laminate 10.

In the semiconductor laminate 10, each of the oxygen concentration, the carbon concentration, and the hydrogen concentration at each of the interface between the first semiconductor layer 12 and the quantum-well structure 13, the interface between the quantum-well structure 13 and the second semiconductor layer 14, the interface between the second semiconductor layer 14 and the third semiconductor layer 15, and the interface between the third semiconductor layer 15 and the fourth semiconductor layer 16 is preferably $1 \times 10^{17}$ cm$^{-3}$ or less.

In this case, the dark current of a light-receiving element produced with the semiconductor laminate 10 can be inhibited.

In the semiconductor laminate 10, the first semiconductor layer 12, the quantum-well structure 13, the second semiconductor layer 14, the third semiconductor layer 15, and the fourth semiconductor layer 16 are preferably stacked without forming a regrown interface. In this case, the dark current of the light-receiving element produced with the semiconductor laminate 10 can be inhibited.

The case where the substrate 11 and the first semiconductor layer 12 have n-type conductivity and where the second semiconductor layer 14 and the fourth semiconductor layer 16 have p-type conductivity has been described in the foregoing embodiment; however, the substrate 11 and the first semiconductor layer 12 may have p-type conductivity, and the second semiconductor layer 14 and the fourth semiconductor layer 16 may have n-type conductivity. In this case, as an n-type impurity contained in the second semiconductor layer 14, for example, one or more elements selected from the group consisting of Si, S, Se, Ge, Te, and Sn may be used. The concentration of the n-type impurity contained in the second semiconductor layer 14 may be, for example, $5 \times 10^{14}$ cm$^{-3}$ or more and $5 \times 10^{18}$ cm$^{-3}$ or less. The case where the second semiconductor layer 14 has a conductivity type different from the first semiconductor layer 12 in the foregoing embodiment has been described; however, the second semiconductor layer 14 may have the same conductivity type as the first semiconductor layer 12.

Figure 2:
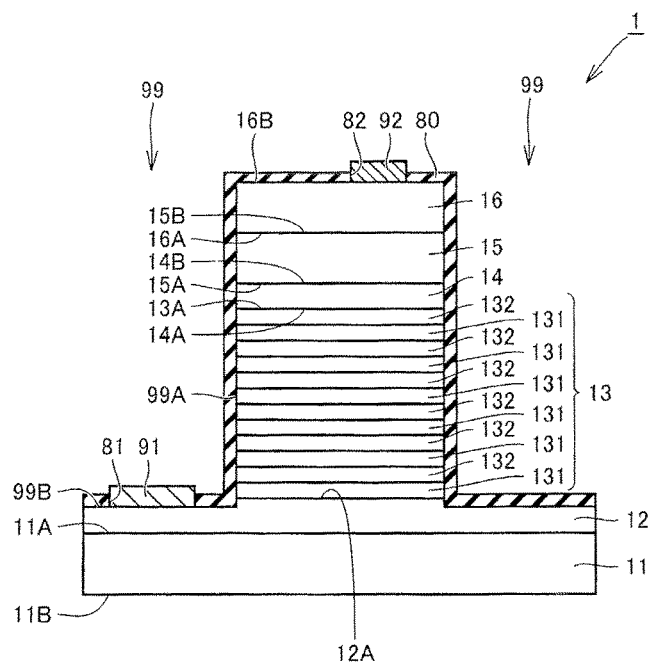
FIG. 2 is a schematic cross-sectional view illustrating the structure of a light-receiving element according to the first embodiment.

An infrared light-receiving element 1 (photodiode), which is an example of light-receiving elements produced with the semiconductor laminate 10, will be described below. As illustrated in FIG. 2, an infrared light-receiving element 1 according to this embodiment is produced with the semiconductor laminate 10 according to the foregoing embodiment and includes the substrate 11, the first semiconductor layer 12, the quantum-well structure 13, the second semiconductor layer 14, the third semiconductor layer 15, and the fourth semiconductor layer 16, which are stacked similarly to the semiconductor laminate 10. The infrared light-receiving element 1 includes trenches 99 each extending to the first semiconductor layer 12 through the fourth semiconductor layer 16, the third semiconductor layer 15, the second semiconductor layer 14, and the quantum-well structure 13. That is, the fourth semiconductor layer 16, the third semiconductor layer 15, the second semiconductor layer 14, and the quantum-well structure 13 are exposed at side walls 99A of the trenches 99. Bottom walls 99B of the trenches 99 are located in the first semiconductor layer 12. That is, the first semiconductor layer 12 is exposed at the bottom walls 99B of the trenches 99.

The infrared light-receiving element 1 further includes a passivation film 80, an n-side electrode 91, and a p-side electrode 92. The passivation film 80 is disposed so as to cover the bottom walls 99B of the trenches 99, the side walls 99A of the trenches 99, and a main surface 16B of the fourth semiconductor layer 16 facing away from the third semiconductor layer 15. The passivation film 80 contains an insulating material such as silicon nitride or silicon oxide.

An opening portion 81 is provided in the passivation film 80 covering the bottom walls 99B of the trenches 99 and extends through the passivation film 80 in the thickness direction. The n-side electrode 91 is disposed in such a manner that the opening portion 81 is filled with the n-side electrode 91. The n-side electrode 91 is disposed so as to be in contact with the first semiconductor layer 12 exposed at the opening portion 81. The n-side electrode 91 contains a conductive material such as a metal. More specifically, the n-side electrode 91 may contain, for example, Ti (titanium)/Pt (platinum)/Au (gold). The n-side electrode 91 forms an ohmic contact with the first semiconductor layer 12.

An opening portion 82 is provided in the passivation film 80 covering the main surface 16B of the fourth semiconductor layer 16 and extends through the passivation film 80 in the thickness direction. The p-side electrode 92 is disposed in such a manner that the opening portion 82 is filled with the p-side electrode 92. The p-side electrode 92 is disposed so as to be in contact with the fourth semiconductor layer 16 exposed at the opening portion 82. The p-side electrode 92 contains a conductive material such as a metal. More specifically, the p-side electrode 92 may contain, for example, Ti/Pt/Au. The p-side electrode 92 forms an ohmic contact with the fourth semiconductor layer 16.

When infrared light is incident on the infrared light-receiving element 1, the infrared light is absorbed between quantum levels in the quantum-well structure 13 to generate electron-hole pairs. The generated electrons and holes are taken from the infrared light-receiving element 1 as photocurrent signals. Thus, infrared light is detected.

The p-side electrode 92 is a pixel electrode. The infrared light-receiving element 1 may include only a single p-side electrode 92 as illustrated in FIG. 2 or may include a plurality of pixel electrodes (p-side electrodes 92). Specifically, the infrared light-receiving element 1 may have a structure in which unit structures each illustrated in FIG. 2 are arranged in the direction in which the first main surface 11A of the substrate 11 extends in FIG. 2. In this case, the infrared light-receiving element 1 includes the p-side electrodes 92 corresponding to the pixels, and only a single n-side electrode 91 is arranged. This structure will be described in a second embodiment below.

The infrared light-receiving element 1 according to the embodiment includes the semiconductor laminate 10. Thus, the infrared light-receiving element 1 is a light-receiving element having good sensitivity.

The outline of a method for producing the semiconductor laminate 10 and the infrared light-receiving element 1 according to the embodiment will be described below with reference to FIGS. 3 to 8.

Figure 3:
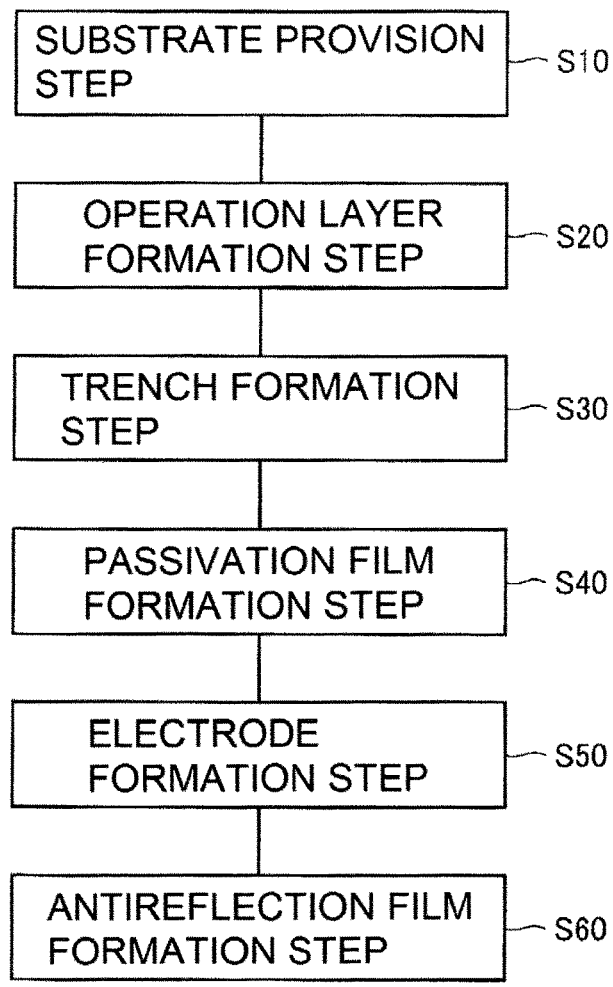
FIG. 3 is a flow chart schematically illustrating a method for producing a semiconductor laminate and a light-receiving element according to the first embodiment.
Figure 4:
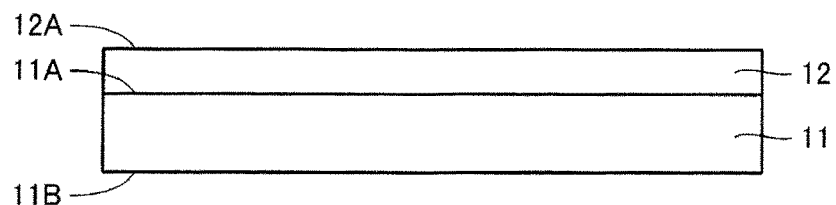
FIG. 4 is a schematic cross-sectional view illustrating the method for producing a semiconductor laminate and a light-receiving element according to the first embodiment.

As illustrated in FIG. 3, in the method for producing the semiconductor laminate 10 and the infrared light-receiving element 1 according to the embodiment, a substrate provision step is first performed as step (S10). As illustrated in FIG. 4, for example, the substrate 11 having a diameter of 2 inches (50.8 mm) and containing InP is provided in this step (S10). More specifically, an ingot containing InP is sliced to provide the substrate 11 containing InP. The substrate 11 is subjected to surface polishing and then to a process such as washing, thereby providing the substrate 11 having the main surface 11A with good flatness and good cleanliness.

Subsequently, an operation layer formation step is performed as step (S20). In step (S20), the first semiconductor layer 12, the quantum-well structure 13, the second semiconductor layer 14, the third semiconductor layer 15, and the fourth semiconductor layer 16, which are operation layers, are formed on the main surface 11A of the substrate 11 provided in step (S10). The formation of the operation layers can be performed by, for example, metal-organic vapor phase epitaxy. The formation of the operation layers by the metal-organic vapor phase epitaxy can be performed by, for example, placing the substrate 11 on a rotary table equipped with a heater for heating the substrate and supplying source gases onto the substrate while the substrate 11 is heated by the heater.

As illustrated in FIG. 4, in step (S20), the first semiconductor layer 12 containing n-InGaAs, which is a III-V group compound semiconductor, is formed by the metal-organic vapor phase epitaxy so as to be in contact with the first main surface 11A of the substrate 11. In the formation of the first semiconductor layer 12 containing n-InGaAs, examples of an In source material that can be used include trimethylindium (TMIn) and triethylindium (TEIn). Examples of a Ga source material that can be used include triethylgallium (TEGa) and trimethylgallium (TMGa). Examples of an As source material that can be used include tert-butylarsine (TBAs) and trimethylarsine (TMAs).

Figure 5:
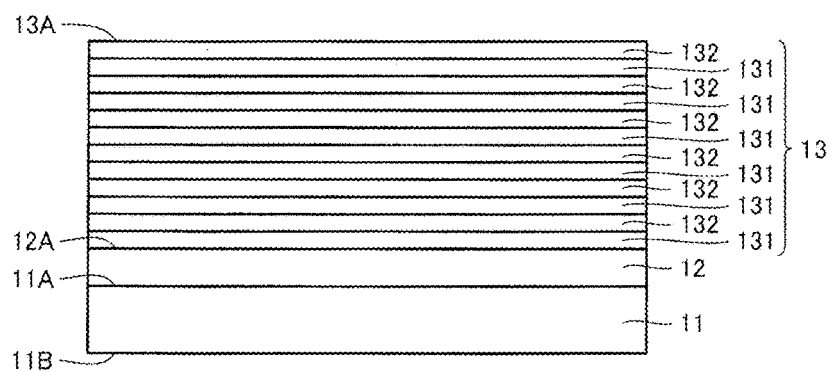
FIG. 5 is a schematic cross-sectional view illustrating the method for producing a semiconductor laminate and a light-receiving element according to the first embodiment.

As illustrated in FIGS. 4 and 5, the quantum-well structure 13 is formed by alternately stacking, for example, the first element layers 131 containing $In_xGa_{1-x}As$ (where x represents 0.38 or more and 1 or less), which is a III-V group compound semiconductor, and the second element layers 132 containing $GaAs_{1-y}Sb_y$ (where y represents 0.36 or more and 1 or less), which is a III-V group compound semiconductor, so as to be in contact with the first main surface 12A of the first semiconductor layer 12 facing away from the substrate 11. The formation of the quantum-well structure 13 can be performed by the metal-organic vapor phase epitaxy subsequently to the formation of the first semiconductor layer 12. That is, the formation of the quantum-well structure 13 can be performed by changing the source gases while the substrate 11 is disposed in an apparatus used for the formation of the first semiconductor layer 12. The quantum-well structure 13 is formed so as to have a thickness of 1 μm or more.

In the formation of the first element layer 131 containing $In_xGa_{1-x}As$ (x represents 0.38 or more and 1 or less), for example, TMIn or TEIn may be used as an In source material. For example, TEGa or TMGa may be used as a Ga source material. For example, TBAs or TMAs may be used as an As source material. In the formation of the second element layer 132 containing $GaAs_{1-y}Sb_y$ (where y represents 0.36 or more and 1 or less), for example, TEGa or TMGa may be used as a Ga source material. For example, TBAs or TMAs may be used as an As source material. For example, trimethylantimony (TMSb), triethylantimony (TESb), triisopropylantimony (TIPSb), tris(dimethylamino) antimony (TDMASb), or tri-tert-butyl antimony (TTBSb) may be used as an Sb source material. Thereby, the quantum-well structure 13, which is a type II quantum wells, can be formed.

Figure 6:
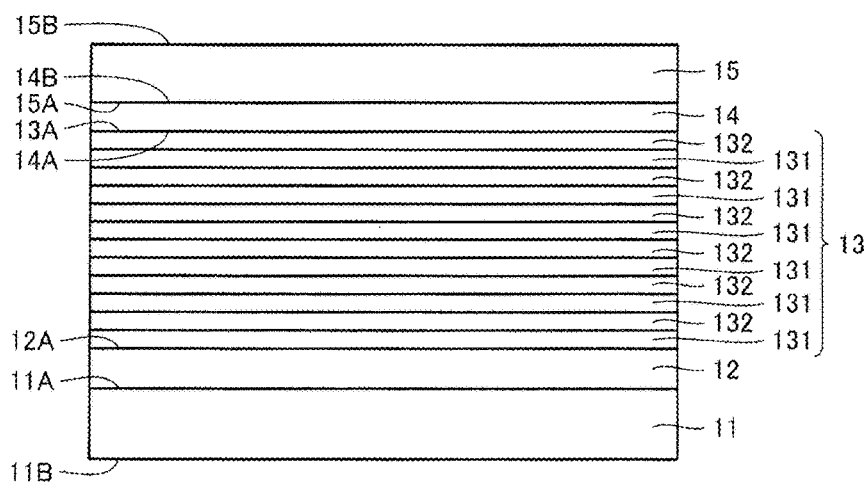
FIG. 6 is a schematic cross-sectional view illustrating the method for producing a semiconductor laminate and a light-receiving element according to the first embodiment.

As illustrated in FIGS. 5 and 6, the second semiconductor layer 14 containing, for example, $In_xGa_{1-x}As$ (where x represents 0.38 or more and 1 or less) or $GaAs_{1-y}Sb_y$ (where y represents 0.36 or more and 1 or less), which is a III-V group compound semiconductor having p-type conductivity, is formed so as to be in contact with the main surface 13A of the quantum-well structure 13 facing away from the first semiconductor layer 12. The formation of the second semiconductor layer 14 can be performed by the metal-organic vapor phase epitaxy subsequently to the formation of the quantum-well structure 13. The formation of the second semiconductor layer 14 can be performed by further introducing a source gas to add a p-type impurity thereto in the same procedure as for the first element layer 131 or the second element layer 132.

As illustrated in FIG. 6, the third semiconductor layer 15 containing, for example, InGaAs, which is a III-V group compound semiconductor, is formed so as to be in contact with the second main surface 14B of the second semiconductor layer 14 facing away from the quantum-well structure 13. The formation of the third semiconductor layer 15 can be performed by the metal-organic vapor phase epitaxy subsequently to the formation of the second semiconductor layer 14. The formation of the third semiconductor layer 15 can be performed by omitting the introduction of the source gas to add the n-type impurity thereto in the same procedure as for the first semiconductor layer 12. That is, the third semiconductor layer 15 may be a semiconductor layer containing undoped InGaAs.

As illustrated in FIGS. 6 and 1, the fourth semiconductor layer 16 containing, for example, p-InGaAs, which is a III-V group compound semiconductor having p-type conductivity, is formed so as to be in contact with the main surface 15B of the third semiconductor layer 15 facing away from the second semiconductor layer 14. The formation of the fourth semiconductor layer 16 can be performed by the metal-organic vapor phase epitaxy subsequently to the formation of the third semiconductor layer 15.

The semiconductor laminate 10 according to the embodiment is completed through the foregoing procedure. As described above, the implementation of step (S20) by the metal-organic vapor phase epitaxy can improve the production efficiency of the semiconductor laminate 10. Step (S20) is not limited to a step performed by the metal-organic vapor phase epitaxy with only organometallic source materials (metal-organic vapor phase epitaxy that uses only organometallic source materials). For example, Step (S20) may be performed by, for example, metal-organic vapor phase epitaxy with hydrides such as $AsH_3$ (arsine) serving as an As source material and $SiH_4$ (silane) serving as a Si source material. However, the use of the metal-organic vapor phase epitaxy that uses only organometallic source materials can result in the semiconductor laminate 10 including high-quality crystals. The semiconductor laminate 10 can also be produced by a method other than the metal-organic vapor phase epitaxy. For example, molecular beam epitaxy (MBE) may be employed.

Preferably, the step (S20) is continuously performed by changing source gases with the substrate 11 disposed in the apparatus, as described above. That is, step (S20) is preferably performed in such a manner that the first semiconductor layer 12, the quantum-well structure 13, the second semiconductor layer 14, the third semiconductor layer 15, and the fourth semiconductor layer 16 are stacked without forming a regrown interface. This can inhibit the dark current.

Figure 7:
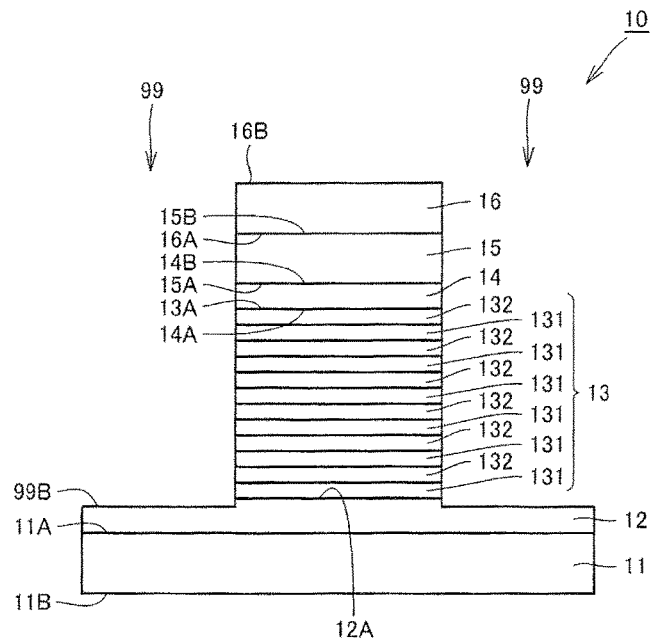
FIG. 7 is a schematic cross-sectional view illustrating the method for producing a semiconductor laminate and a light-receiving element according to the first embodiment.

As illustrated in FIG. 3, a trench formation step is performed as step (S30). In step (S30), as illustrated in FIGS. 1 and 7, the trenches 99 are formed in the semiconductor stack 10 produced through steps S10 and S20, each of the trenches 99 extending to the first semiconductor layer 12 through the fourth semiconductor layer 16, the third semiconductor layer 15, the second semiconductor layer 14, and the quantum-well structure 13. The trenches 99 can be formed by, for example, forming a mask layer on the main surface 16B of the fourth semiconductor layer 16, the mask having openings corresponding to the shape of the trenches 99, and then performing etching.

Figure 8:
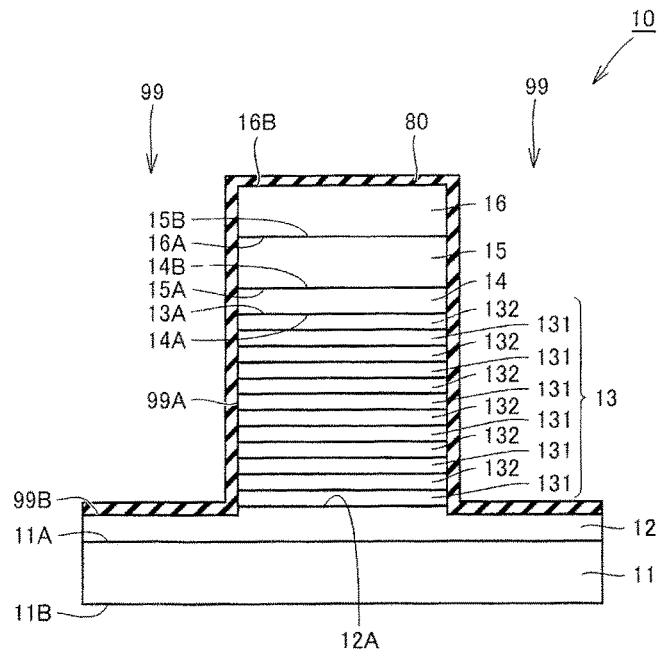
FIG. 8 is a schematic cross-sectional view illustrating the method for producing a semiconductor laminate and a light-receiving element according to the first embodiment.

Next, a passivation film formation step is performed as step (S40). In step (S40), as illustrated in FIGS. 7 and 8, the passivation film 80 is formed on the semiconductor laminate 10 including the trenches 99 formed in step (S30). Specifically, the passivation film 80 containing an insulating material such as silicon oxide or silicon nitride is formed by, for example, chemical vapor deposition (CVD). The passivation film 80 is formed so as to cover the bottom walls 99B of the trenches 99, the side walls 99A of the trenches 99, and the main surface 16B of the fourth semiconductor layer 16 facing away from the third semiconductor layer 15.

Subsequently, an electrode formation step is performed as step (S50). In step (S50), as illustrated in FIGS. 8 and 2, the n-side electrode 91 and the p-side electrode 92 are formed on the semiconductor laminate 10 including the passivation film 80 formed in step (S40). Specifically, for example, a mask having openings at positions corresponding to regions where the n-side electrode 91 and the p-side electrode 92 are to be formed is formed on the passivation film 80. The opening portions 81 and 82 are formed in the passivation film 80 with the mask. Then the n-side electrode 91 and the p-side electrode 92 containing an appropriate conductive material are formed by, for example, an evaporation method. The infrared light-receiving elements 1 according to the embodiment are completed through the foregoing steps. The infrared light-receiving elements 1 are divided into individual elements by, for example, dicing.

Second Embodiment

Figure 9:
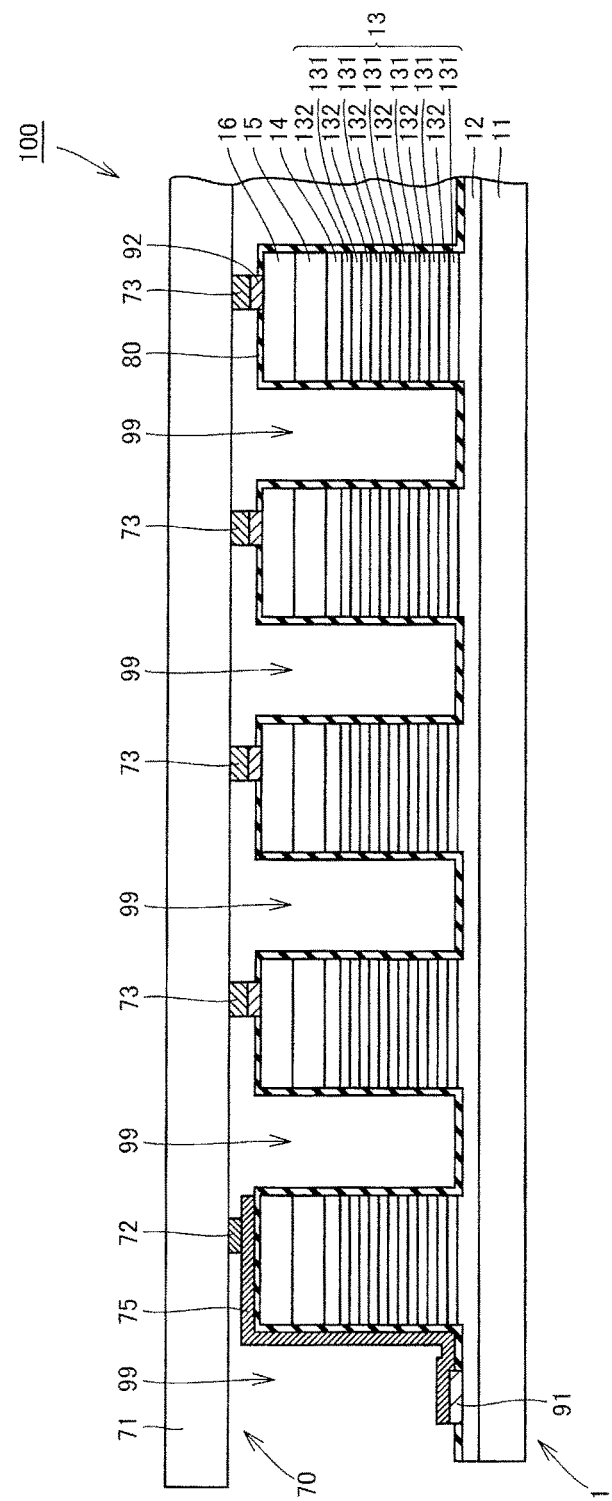
FIG. 9 is a schematic cross-sectional view illustrating the structure of a light-receiving element and a sensor according to a second embodiment.

A light-receiving element and a sensor, which are of another embodiment of the light-receiving element according to the present invention, according to a second embodiment will be described below. As illustrated in FIGS. 9 and 2, the infrared light-receiving element 1 according to the second embodiment has a structure in which the unit structures each illustrated in FIG. 2 are arranged in the direction in which the first main surface 11A of the substrate 11 extends. The infrared light-receiving element 1 includes the p-side electrodes 92 corresponding to pixels. Only a single n-side electrode 91 is disposed.

More specifically, as illustrated in FIG. 9, the n-side electrode 91 of the infrared light-receiving element 1 according to the second embodiment is disposed on the bottom wall of the trench 99 located at an end in a direction in which the substrate 11 extends. The p-side electrode 92 on the fourth semiconductor layer 16 adjacent to the trench 99 located at the end is omitted. An infrared sensor 100 according to the embodiment includes the infrared light-receiving element 1 having the structure and a read-out integrated circuit (ROIC) 70 electrically connected to the infrared light-receiving element 1. The read-out integrated circuit 70 is, for example, a complementary metal oxide semiconductor (CMOS) circuit.

Read-out electrodes (not illustrated) arranged on a main body 71 of the read-out integrated circuit 70 are electrically connected to the respective p-side electrodes 92 functioning as pixel electrodes in the infrared light-receiving element 1 through bumps 73. The infrared light-receiving element 1 also includes a lead 75 that is in contact with the n-side electrode 91, that extends along the bottom wall and the side wall of the trench 99 at which the n-side electrode 91 is located, and that extends to the top of the fourth semiconductor layer 16. The lead 75 is electrically connected to a ground electrode (not illustrated) disposed on the main body 71 of the read-out integrated circuit 70 through a bump 72. In this structure, light reception information for each pixel of the infrared light-receiving element 1 is output from a corresponding one of the p-side electrodes 92 (pixel electrodes) to a corresponding one of the read-out electrodes of the read-out integrated circuit 70. The light reception information sets are collected by the read-out integrated circuit 70 to provide, for example, a two-dimensional image.

EXAMPLES

An experiment was performed in order to study the relationship between the sensitivity and the concentration of an impurity in and the thickness of a second semiconductor layer. An experimental procedure is described below.

The infrared light-receiving element 1 having the same structure as in the first embodiment was produced. A compound semiconductor contained in the substrate 11 was n-InP (impurity: S). As a compound semiconductor contained in the first semiconductor layer 12, n-InGaAs doped with Si serving as an n-type impurity in a concentration of $1\times10^{18}$ cm$^{-3}$ was used. The first semiconductor layer 12 had a thickness of 150 nm. In the quantum-well structure 13, a compound semiconductor contained in the first element layer 131 was InGaAs, and a compound semiconductor contained in the second element layer 132 was GaAsSb. Each of the first element layer 131 and the second element layer 132 had a thickness of 5 nm. The quantum-well structure 13 was a structure in which 250 unit structures each including the first element layer 131 and the second element layer 132 were stacked.

As a compound semiconductor contained in the second semiconductor layer 14, p-InGaAs doped with Zn serving as a p-type impurity was used. As a compound semiconductor contained in the third semiconductor layer 15, undoped InGaAs was used. The third semiconductor layer 15 had a thickness of 600 nm. As a compound semiconductor contained in the fourth semiconductor layer 16, p-InGaAs doped with Zn serving as a p-type impurity in a concentration of $5\times10^{18}$ cm$^{-3}$ was used. The fourth semiconductor layer 16 had a thickness of 100 nm. The infrared light-receiving elements 1 having different concentrations of Zn (impurity concentration) introduced into the second semiconductor layers 14 and different thicknesses of the second semiconductor layers 14 as given in Table 1 were produced, and an experiment to study the sensitivity was performed.

The impurity concentrations in the layers were identified with a double-focusing magnetic sector secondary ion mass spectrometer (SIMS). Cesium ions (Cs$^+$) were used for sputtering in analysis with the SIMS. The acceleration voltage of the cesium ions were 5 keV. The beam diameter was 20 μm or less. A raster area was a 150 μm×150 μm square. The analysis area was a circular area having a diameter of 60 μm. The degree of vacuum at the time of measurement was $1\times10^{-7}$ Pa. The sensitivity was measured by allowing light having a wavelength of 2.2 μm to enter the substrate 11 at a reverse bias of 2 V and a measurement temperature of −50° C. Table 1 lists the measurement results.

TABLE 1

|  |  | Impurity concentration (cm$^{-3}$) | | | |
| --- | --- | --- | --- | --- | --- |
|  |  | $5\times10^{14}$ | $1\times10^{16}$ | $5\times10^{17}$ | $5\times10^{18}$ |
| Thickness (nm) | 50 | 0.4 A/W | 1.2 A/W | 1.2 A/W | 0.5 A/W |
|  | 150 | 1.2 A/W | 1.2 A/W | 0.7 A/W | 0.2 A/W |
|  | 300 | 1.2 A/W | 0.8 A/W | 0.4 A/W | 0.2 A/W |
|  | 500 | 0.6 A/W | 0.3 A/W | 0.2 A/W | 0.1 A/W |

As presented in Table 1, all the infrared light-receiving elements 1 each including the second semiconductor layer 14 having an impurity concentration of $5\times10^{14}$ cm$^{-3}$ to $5\times10^{18}$ cm$^{-3}$ and a thickness of 50 to 500 nm had sensitivity. In the case of a thickness of 50 nm, particularly good sensitivity was obtained in an impurity concentration range of $1\times10^{16}$ cm$^{-3}$ to $5\times10^{17}$ cm$^{-3}$. In the case of the second semiconductor layer 14 having a thickness of 150 nm, particularly good sensitivity was obtained in an impurity concentration range of $5\times10^{14}$ cm$^{-3}$ to $1\times10^{16}$ cm$^{-3}$. In the case of the second semiconductor layer 14 having a thickness of 300 nm, particularly good sensitivity was obtained at an impurity concentration of $5\times10^{14}$ cm$^{-3}$. In the case of the second semiconductor layer 14 having a thickness of 500 nm, good sensitivity was obtained at an impurity concentration of $5\times10^{14}$ cm$^{-3}$.

The tendency, obtained by the experimental results, of an increase or decrease in sensitivity as the impurity concentration in and the thickness of the second semiconductor layer 14 are changed indicates that in the case of a high impurity concentration in the second semiconductor layer 14, specifically, in the case of an impurity concentration of more than $5\times10^{18}$ cm$^3$, a difficulty lies in obtaining sufficient sensitivity. This is presumably because of the generation of carriers due to the impurity introduced into the second semiconductor layer 14. Also in the case of a low impurity concentration in the second semiconductor layer 14, specifically, in the case of an impurity concentration of less than $5\times10^{14}$ cm$^{-3}$, a difficulty lies in obtaining sufficient sensitivity. The reason for this is presumably that the second semiconductor layer 14 having a low impurity concentration is in contact with the quantum-well structure 13 to accumulate carriers at the interface. In the case of the second semiconductor layer 14 having a large thickness, specifically, in the case of the second semiconductor layer 14 having a thickness of more than 500 nm, a difficulty lies in obtaining sufficient sensitivity. This is presumably because of the generation of carriers due to the impurity introduced into the second semiconductor layer 14.

Regarding each of the infrared light-receiving elements having good sensitivity in the experiment described above, a carrier concentration distribution at and near the interface between the second semiconductor layer 14 and the quantum-well structure 13 in the thickness direction was studied. Furthermore, the relationship between the reverse bias value and the extension of the depletion layer of the infrared light-receiving element in operation was studied.

Figure 10:
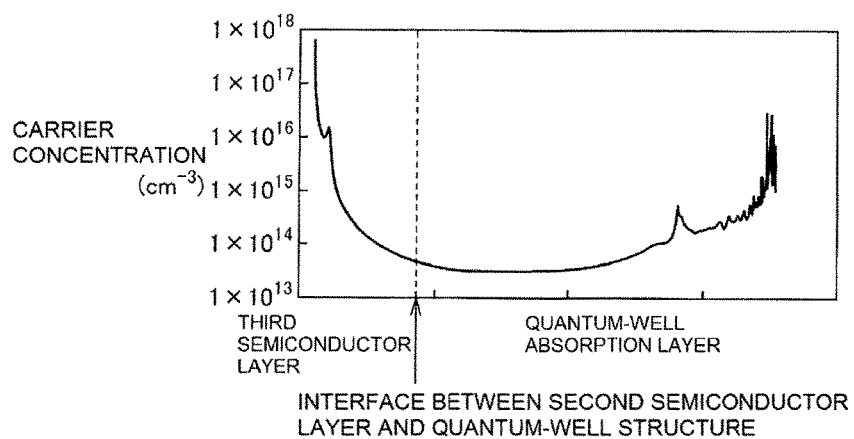
FIG. 10 illustrates the profile of the carrier concentration in a light-receiving element.
Figure 11:
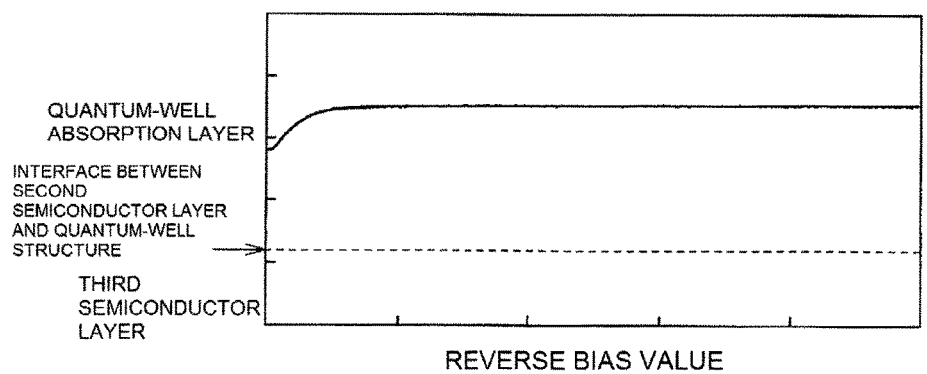
FIG. 11 illustrates the extension of a depletion layer in a light-receiving element.

In FIG. 10, the horizontal axis corresponds to a position in the thickness direction. In FIG. 10, the vertical axis represents the carrier concentration. In FIG. 11, the horizontal axis represents the reverse bias value during the sensitivity measurement. In FIG. 11, the reverse bias value increases with increasing distance from the vertical axis. In FIG. 11, the vertical axis represents a position in the thickness direction. A curve in FIG. 11 represents how far the depletion layer extends from the third semiconductor layer.

FIG. 10 reveals that in this infrared light-receiving element, a region having a high carrier concentration is not formed in the vicinity of the interface between the second semiconductor layer and the quantum-well structure. FIG. 11 reveals that because the region having a high carrier concentration is not formed, the depletion layer reaches the quantum-well absorption layer even at a small reverse bias value, thereby providing good sensitivity. In contrast, when a region having a high carrier concentration is formed at and near the interface between the second semiconductor layer and the quantum-well structure, the depletion layer does not reach the quantum-well absorption layer at a small reverse bias value, thereby failing to obtain sensitivity.

The experimental results indicate that the second semiconductor layer 14 preferably has a thickness of 500 nm or less and that the second semiconductor layer preferably has a impurity concentration of $5 \times 10^{14}$ cm$^{-3}$ or more and $5 \times 10^{18}$ cm$^{-3}$ or less.

The embodiments and the examples disclosed herein are to be considered in all respects as illustrative and not limiting. The scope of the invention is defined not by the foregoing description but by the following claims, and is intended to include any modifications within the scope and meaning equivalent to the scope of the claims.

| Reference Signs List | |
|---|---|
| 1 infrared light-receiving element | 10 semiconductor laminate |
| 11 substrate | 11A main surface |
| 12 first semiconductor layer | 12A first main surface |
| 13 quantum-well structure | 131 first element layer |
| 132 second element layer | 13A main surface |
| 14 second semiconductor layer | 14A main surface |
| 14B main surface | 15 third semiconductor layer |
| 15A main surface | 15B main surface |
| 16 fourth semiconductor layer | 16B main surface |
| 70 read-out integrated circuit | 71 main body |
| 72, 73 bump | 75 lead |
| 80 passivation film | 81, 82 opening portion |
| 91 n-side electrode | 92 p-side electrodes |
| 99 trench | 99A side wall |
| 99B bottom wall | 100 infrared sensor |

The invention claimed is:

1. A semiconductor laminate comprising:
    a first semiconductor layer containing a III-V group compound semiconductor and having a first conductivity type;
    a quantum-well absorption layer containing a III-V group compound semiconductor;
    a second semiconductor layer containing a III-V group compound semiconductor;
    a third semiconductor layer containing a III-V group compound semiconductor; and
    a fourth semiconductor layer containing a III-V group compound semiconductor and having a second conductivity type different from the first conductivity type,
    wherein the first semiconductor layer, the quantum-well absorption layer, the second semiconductor layer, the third semiconductor layer, and the fourth semiconductor layer are stacked in this order,
    a concentration of an impurity that generates carriers of the second conductivity type is lower in the third semiconductor layer than in the fourth semiconductor layer, and
    a concentration of an impurity that generates majority carriers in the second semiconductor layer is lower in the third semiconductor layer than in the second semiconductor layer.

2. The semiconductor laminate according to claim 1, wherein each of the concentration of the impurity that generates carriers of the first conductivity type and the concentration of the impurity that generates the carriers of the second conductivity type in the third semiconductor layer is less than $5 \times 10^{14}$ cm$^{-3}$.

3. The semiconductor laminate according to claim 1, wherein the concentration of the impurity that generates the majority carriers in the second semiconductor layer is equal to or lower than the concentration of the impurity that generates the carriers of the second conductivity type in the fourth semiconductor layer.

4. The semiconductor laminate according to claim 1, wherein the concentration of the impurity that generates the majority carriers in the second semiconductor layer is $5 \times 10^{14}$ cm$^{-3}$ or more and $5 \times 10^{18}$ cm$^{-3}$ or less.

5. The semiconductor laminate according to claim 1, wherein the second semiconductor layer has a smaller thickness than the third semiconductor layer.

6. The semiconductor laminate according to claim 1, wherein the second semiconductor layer has a thickness of 500 nm or less.

7. The semiconductor laminate according to claim 1, wherein the impurity that generates the majority carriers in the second semiconductor layer is one or more selected from the group consisting of Si, S, Se, Ge, Te, and Sn, or one or more selected from the group consisting of Zn, Be, Mg, and C.

8. The semiconductor laminate according to claim 1, wherein the quantum-well absorption layer has a multi-quantum-well structure including a pair of an In$_x$Ga$_{1-x}$As (x represents 0.38 or more and 1 or less) layer and a GaAs$_{1-y}$Sb$_y$ (where y represents 0.36 or more and 1 or less) layer, or a pair of a Ga$_{1-u}$In$_u$N$_v$As$_{1-v}$ (where u represents 0.4 or more and 0.8 or less, and v represents more than 0 and 0.2 or less) layer and a GaAs$_{1-y}$Sb$_y$ (where y represents 0.36 or more and 0.62 or less) layer.

9. The semiconductor laminate according to claim 8, further comprising a substrate located on an opposite side of the first semiconductor layer from the quantum-well absorption layer,
    wherein the substrate contains GaAs, GaP, GaSb, InP, InAs, InSb, AlSb, or AlAs.

10. The semiconductor laminate according to claim 1, wherein the second semiconductor layer contains a III-V group compound semiconductor identical to that in the semiconductor layer included in the quantum-well absorption layer.

11. The semiconductor laminate according to claim 1, wherein the quantum-well absorption layer has a thickness of 1 μm or more.

12. The semiconductor laminate according to claim 1, wherein each of an oxygen concentration, a carbon concentration, and a hydrogen concentration at each of an interface between the first semiconductor layer and the quantum-well absorption layer, an interface between the quantum-well absorption layer and the second semiconductor layer, an interface between the second semiconductor layer and the third semiconductor layer, and an interface between the third semiconductor layer and the fourth semiconductor layer is $1 \times 10^{17}$ cm$^{-3}$ or less.

13. A light-receiving element comprising:
the semiconductor laminate according to claim 1; and
an electrode disposed on the semiconductor laminate.

* * * * *